(12) United States Patent
Lee

(10) Patent No.: US 9,754,663 B1
(45) Date of Patent: Sep. 5, 2017

(54) APPARATUS FOR SWITCHING VOLTAGE AND SEMICONDUCTOR MEMORY APPARATUS HAVING THE SAME

(71) Applicant: SK hynix Inc., Gyeonggi-do (KR)

(72) Inventor: Jae Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/296,545

(22) Filed: Oct. 18, 2016

(30) Foreign Application Priority Data

Aug. 29, 2016 (KR) ........................ 10-2016-0110174

(51) Int. Cl.
| | | |
|---|---|---|
| G11C 8/00 | (2006.01) | |
| G11C 16/08 | (2006.01) | |
| G11C 11/56 | (2006.01) | |
| H01L 27/115 | (2017.01) | |
| G11C 16/24 | (2006.01) | |

(52) U.S. Cl.
CPC .......... *G11C 11/5628* (2013.01); *G11C 16/08* (2013.01); *G11C 16/24* (2013.01); *H01L 27/115* (2013.01)

(58) Field of Classification Search
CPC . G11C 11/406; G11C 5/145; G11C 29/12005; G11C 29/06; G11C 29/50; G11C 16/0483; G11C 29/24; G11C 29/34
See application file for complete search history.

(56) References Cited

U.S. PATENT DOCUMENTS

| | | | |
|---|---|---|---|
| 6,268,761 B1 * | 7/2001 | Naganawa ............ | H02M 3/073 327/536 |
| 6,791,395 B2 * | 9/2004 | Kim ........................ | H02M 3/07 327/536 |
| 2005/0232042 A1 * | 10/2005 | Kim .................... | G11C 11/4094 365/203 |

FOREIGN PATENT DOCUMENTS

| | | |
|---|---|---|
| KR | 1020140139265 | 12/2014 |
| KR | 1020150058925 | 5/2015 |

\* cited by examiner

*Primary Examiner* — Hien Nguyen
(74) *Attorney, Agent, or Firm* — IP & T Group LLP

(57) ABSTRACT

A voltage switching apparatus includes a plurality of high voltage switching circuits operable in response to a single control signal, and suitable for pumping a voltage level of a switching signal to a target level based on the voltage level of the switching signal and a common control unit suitable for generating the single control signal.

17 Claims, 11 Drawing Sheets

APPARATUS FOR SWITCHING VOLTAGE AND SEMICONDUCTOR MEMORY APPARATUS HAVING THE SAME

CROSS-REFERENCES TO RELATED APPLICATION

This application claims priority under 35 U.S.C. 119(a) to Korean application No. 10-2016-0110174, filed on Aug. 29, 2016, in the Korean intellectual property Office, which is incorporated by reference in its entirety as set forth in full.

BACKGROUND

1. Technical Field

Various embodiments may generally relate to a semiconductor apparatus and, more particularly, to a voltage switching apparatus and a semiconductor memory apparatus having the same.

2. Related Art

Semiconductor apparatuses may operate using an internal voltage, which is generated from an external voltage.

The voltage level of the external voltage has been increasingly lowered to reduce power consumption of the semiconductor apparatus. However, an internal voltage that is greater than the external voltage may be necessary in the semiconductor apparatus, and thus the semiconductor apparatus may include a high voltage generation circuit.

The high voltage generation circuit may be implemented with a pumping circuit which increases the external voltage to generate the required internal voltage. The internal voltage generated through the pumping circuit may be supplied to elements requiring the same in the semiconductor apparatus through one or more switching elements.

When the internal voltage or the high voltage is transferred through the switching elements, the voltage may be dropped by an amount corresponding to the threshold voltages of the switching elements, and thus the voltage drop needs to be supplemented.

Further lowering of an external voltage, may be achieved by controlling the operation characteristics of the switching elements.

SUMMARY

According to an embodiment, there is provided an improved semiconductor apparatus for switching a voltage for a memory system. The apparatus may include: a plurality of high voltage switching circuits operable in response to a single control signal, and suitable for pumping a voltage level of a switching signal to a target level based on the voltage level of the switching signal; and a common control unit suitable for generating the single control signal.

According to an embodiment, there is provided a semiconductor memory apparatus. The semiconductor memory apparatus may include: a memory cell array including a plurality of memory blocks; a plurality of block selection units coupled to the plurality of memory blocks, and operable in response to a single control signal; and a common control unit suitable for generating the single control signal, wherein the plurality of block selection units select corresponding one among the plurality of memory blocks by decoding a block address and apply a switching signal to the selected memory block in response to the single control signal.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
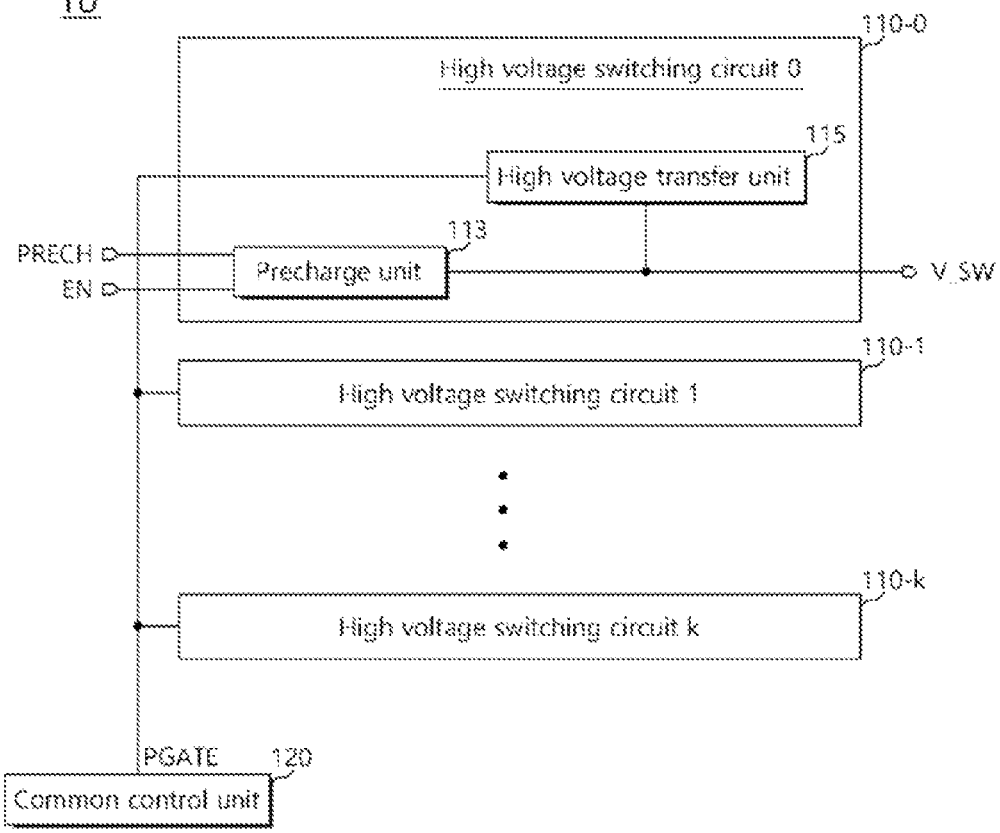
FIG. 1 is a simplified configuration diagram illustrating a voltage switching apparatus according to an embodiment.

Various embodiments will be described in greater detail with reference to the accompanying drawings which present simplified schematic illustrations of various aspects of the present invention. The present invention, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Moreover, it should be understood, that the drawings are simplified illustrations and are not necessarily drawn to scale, nor do they depict details that are not necessary for understanding the present invention. As such, variations from the drawings are to be expected including variations as a result, for example, of manufacturing techniques and/or tolerances. Thus, for example, the described embodiments should not be construed as being limited to the particular shapes illustrated herein but may include deviations in shapes that result, for example, from manufacturing. Also, in the drawings, lengths and sizes of layers and regions may be exaggerated for clarity. Like reference numerals in the drawings denote like elements.

It is also to be understood that when a layer is referred to as being "on" another layer or substrate, it can be directly on the other or substrate, or intervening layers may also be present.

It is also noted that in this specification, "connected/coupled" refers to one component not only directly coupling another component but also indirectly coupling another component through an intermediate component. In addition, a singular form may include a plural form, and vice versa as long as it is not specifically mentioned.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Although a few embodiments of the present invention will be shown and described, it will be appreciated by those of ordinary skill in the art that changes may be made in these exemplary embodiments without departing from the principles and spirit of the present invention.

FIG. 1 is a simplified configuration diagram illustrating a voltage switching apparatus 10, according to an embodiment.

Referring to FIG. 1, the voltage switching apparatus 10 may include a plurality of high voltage switching circuits 110-0 to 110-*k* and a common control unit 120.

Each of the plurality of high voltage switching circuits 110-0 to 110-*k* may include a precharge unit 113 and a high voltage transfer unit 115.

The precharge unit 113 may precharge an output node of a switching signal V_SW in response to a precharge signal PRECH and an enable signal EN.

The high voltage transfer unit 115 may boost up the voltage level of the switching signal V_SW to a target level in response to a single control signal PGATE provided from the common control unit 120.

The common control unit 120 may generate the single control signal PGATE, and the single control signal PGATE may be commonly provided to the plurality of high voltage switching circuits 110-0 to 110-*k*.

Each of the plurality of high voltage switching circuits 110-0 to 110-*k* may commonly receive the single control signal PGATE provided from the common control unit 120. Hence, each of the plurality of high voltage switching circuits 110-0 to 110-*k* do not need to include a control circuit (e.g., a level shifter) for generating the control signal. Accordingly, the area occupied by the voltage switching apparatus 10 may be reduced substantially.

The high voltage transfer unit 115 may be configured, for example, using a depletion high voltage NMOS switching element (DHVN) and a high voltage PMOS switching element (HVP). As the external voltage is gradually lowered and thus the internal voltage is also lowered, it becomes increasingly more difficult to apply a voltage having a sufficiently high level to a gate terminal of the high voltage PMOS switching element, and the intermittence of the high voltage PMOS switching element also becomes difficult.

According to an embodiment, since a single control signal PGATE is generated through the common control unit 120 and is commonly provided to all the high voltage switching circuits 110-0 to 110-*k*, the area efficiency of the voltage switching apparatus 10 and thus the semiconductor apparatus including the same may be improved.

Figure 2:
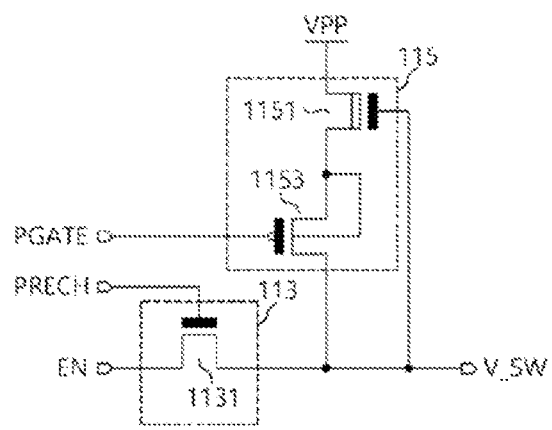
FIG. 2 is a simplified configuration diagram illustrating a high voltage switching circuit of FIG. 1.

FIG. 2 is a simplified configuration diagram illustrating one of the high voltage switching circuits 110-0 to 110-*k*, generally designated with numeral 110-X, according to an embodiment.

Referring to FIG. 2, the precharge unit 113 of the high voltage switching circuit 110-*x* may include a first switching element 1131 for precharging the output node of the switching signal V_SW based on the enable signal EN in response to the precharge signal PRECH. In an embodiment, the first switching element 1131 may be a tripe well high voltage NMOS switching element THVN.

The high voltage transfer unit 115 may include a second switching element 1151 and a third switching element 1153. The second switching element 1151 may transfer a high voltage VPP to the third switching element 1153 according to the voltage level of the switching signal V_SW. The second switching element 1151 may be configured of, for example, a depletion high voltage NMOS switching element DHVN.

The third switching element 1153 may transfer a high voltage, which is output from the second switching element 1151, to the output node of the switching signal V_SW in response to the control signal PGATE. The third switching element 1153 may be configured of, for example, a high voltage PMOS switching element HVP.

Despite enablement of the enable signal EN, the high voltage transfer operation may not be performed in the high voltage switching circuit 110-*x* until the precharge signal PRECH and the control signal PGATE are enabled.

The precharge signal PRECH and the control signal PGATE may be simultaneously or sequentially enabled in a pulse form during the enablement of the enable signal EN.

When the precharge signal PRECH generated in a pulse form is enabled, the enable signal EN may experience a voltage drop by an amount of a threshold voltage of the first switching element 1131 as transferred to the output node of the switching signal V_SW. The output signal of the first switching element 1131 may be the switching signal V_SW.

The control signal PGATE may be generated in a pulse form. As the control signal PGATE is enabled, the third switching element 1153 may transfer the voltage output from the second switching element 1151 to the output node of the switching signal V_SW thereby raising a voltage level of the switching signal V_SW. The second switching element 1151 may provide the high voltage to the third switching element 1153 through feedback of the voltage level of the switching signal V_SW. The second switching element 1151 may boost up the voltage level of the switching signal V_SW based on the high voltage VPP and a threshold voltage of the second switching element 1151. Through this repetitive process, the level of the switching signal V_SW may be boosted up to a level of the high voltage VPP.

When the level of the switching signal V_SW is equal to or greater than a predetermined level during the high voltage transfer process of the high voltage transfer unit 115, the third switching element 1153 may keep turned on even when the control signal PGATE which controls ON/OFF of the third switching element 1153 is disabled. When the sum of the threshold voltage and source-gate voltage of the third switching element 1153 is greater than 0 (zero), the third switching element 1153 may keep turned on.

Accordingly, the control signal PGATE may be a pulse signal enabled after the voltage of the enable signal EN is applied to the output node of the switching signal V_SW by the precharge signal PRECH and disabled when the output voltage of the second switching element 1151 reaches a voltage level sufficient to maintain the turn-on state of the third switching element 1153.

Accordingly, even when the control signal PGATE is enabled only for the above-described time duration, the level of the switching signal V_SW may be boosted up to the high voltage level VPP.

Figure 3:
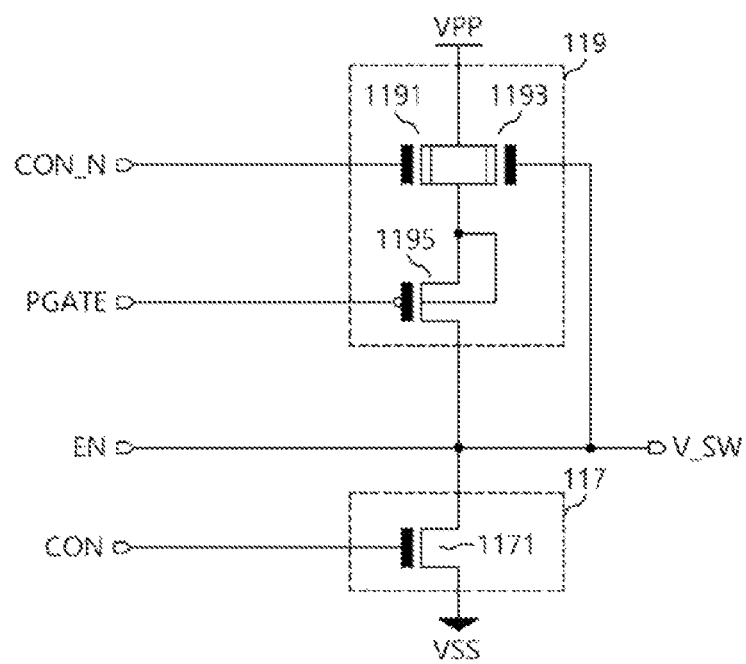
FIG. 3 is a simplified configuration diagram illustrating a high voltage switching circuit of FIG. 1.

FIG. 3 is a simplified configuration diagram illustrating one of the high voltage switching circuits 110-0 to 110-k, generally designated with numeral 110-y, according to another embodiment.

The high voltage switching circuit 110-y may include a discharge unit 117 and a high voltage transfer unit 119.

The discharge unit 117 may include a first switching element 1171, which is coupled between an input node of the enable signal EN or the output node of the switching signal V_SW and a ground terminal VSS. The discharge unit 117 discharges the voltage of the output node of the switching signal V_SW in response to a select signal CON. The input node of the enable signal EN and the output node of the switching signal V_SW may be the same. In an embodiment, the first switching element 1171 may be a high voltage NMOS switching element HVN.

The high voltage transfer unit 119 may include a second switching element 1191, a third switching element 1193, and a fourth switching element 1195.

The second switching element 1191 may be driven in response to an inverting signal CON_N of the select signal CON and may be configured of, for example, a depletion high voltage NMOS switching element (DHVN). The voltage transfer characteristic of the high voltage transfer unit 119 may be further improved through the second switching element 1191.

The third switching element 1193 may transfer the high voltage VPP to the fourth switching element 1195 according to the voltage level of the switching signal V_SW. The third switching element 1193 may be configured of, for example, a depletion high voltage NMOS switching element DHVN.

The fourth switching element 1195 may transfer the high voltage, which is output from the second switching element 1191 and the third switching element 1193, to the output node of the switching signal V_SW in response to the control signal PGATE. The fourth switching element 1195 may be configured of, for example, a high voltage PMOS switching element HVP.

The select signal CON may be a signal for selecting one of the plurality of switching circuits 110-0 to 110-k.

The control signal PGATE may be a pulse signal enabled after the voltage of the enable signal EN is applied to the output node of the switching signal V_SW In response to the select signal CON and disabled when the output voltage of the second and third switching elements 1191 and 1193 reaches a voltage level sufficient to maintain the turn-on state of the fourth switching element 1195.

Figure 4:
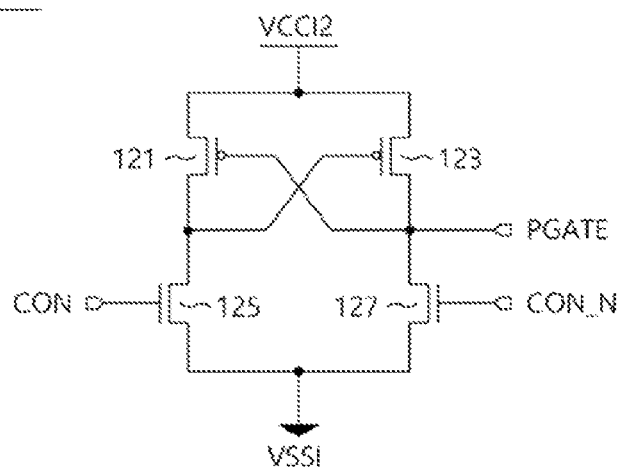
FIG. 4 is a simplified configuration diagram Illustrating a common control unit of FIG. 1.

FIG. 4 is a simplified diagram illustrating an example configuration of the common control unit 120.

Referring to FIG. 4, the common control unit 120 may include voltage providing units 121 and 123 and sink units 125 and 127.

The common control unit 120 may be driven in response to the select signal CON and the inverting signal CON_N of the select signal CON. When the select signal CON has a high level, the control signal PGATE having a second power supply voltage level VCCI2 may be output. When the select signal CON has a low level, the control signal PGATE having a ground voltage level VSSI may be output.

As described above, the select signal CON may be a signal for selecting one of the plurality of high voltage switching circuits 110-0 to 110-k.

Each of the plurality of high voltage switching circuits 110-0 to 110-k may include the high voltage transfer unit 115, and the high voltage transfer unit 115 may be driven by the single control signal PGATE generated in the common control unit 120. Therefore, only the selected high voltage switching circuits among the plurality of the high voltage switching circuits 110-0 to 110-k need to perform the high voltage switching operation whereas the remaining non-selected high voltage switching circuits need not to perform the high voltage switching operation.

As described above, when a voltage having a level equal to or greater than the predetermined level is applied to a source terminal of the high voltage PMOS switching element (HVP), the high voltage PMOS switching element (HVP) driven in response to the control signal PGATE may be kept turned-on regardless of the level of the control signal PGATE.

Accordingly, the control signal PGATE may be a pulse signal enabled after the voltage of the enable signal EN is applied to the output node of the switching signal V_SW by the select signal CON and disabled when a voltage applied to the source terminal of the high voltage PMOS switching element 1153 and 1195 reaches a level sufficient to maintain the turn-on state of the high voltage PMOS switching element 1153 and 1195.

Only the voltage of the output node of the switching signal V_SW in the selected high voltage switching circuit may be boosted up to the level of the high voltage VPP, and the voltage levels of the output nodes of the switching signal V_SW in the non-selected high voltage switching circuits may be maintained to a ground voltage level VSSI. Accordingly, even when the same single control signal PGATE is applied to all the high voltage switching circuits 110-0 to 110-k, the high voltage transfer operation which boosts up the voltage level of the output node of the switching signal V_SW to the level of the high voltage VPP is accomplished only for the selected high voltage switching circuit.

FIGS. 5 to 8 are illustrative timing diagrams explaining a control method of the voltage switching apparatus 10 including the high voltage switching circuit of FIG. 2.

The voltage switching apparatus 10 may be applied to, for example, a block selection circuit of a flash memory apparatus. The select signal CON may be generated in response to a block switching signal BLK_SW and address signals XA, XB, XC, and XD. The enable signal EN may be generated to determine an initial voltage of the output node of the switching signal V_SW in response to the precharge signal PRECH or the select signal CON.

Figure 5:
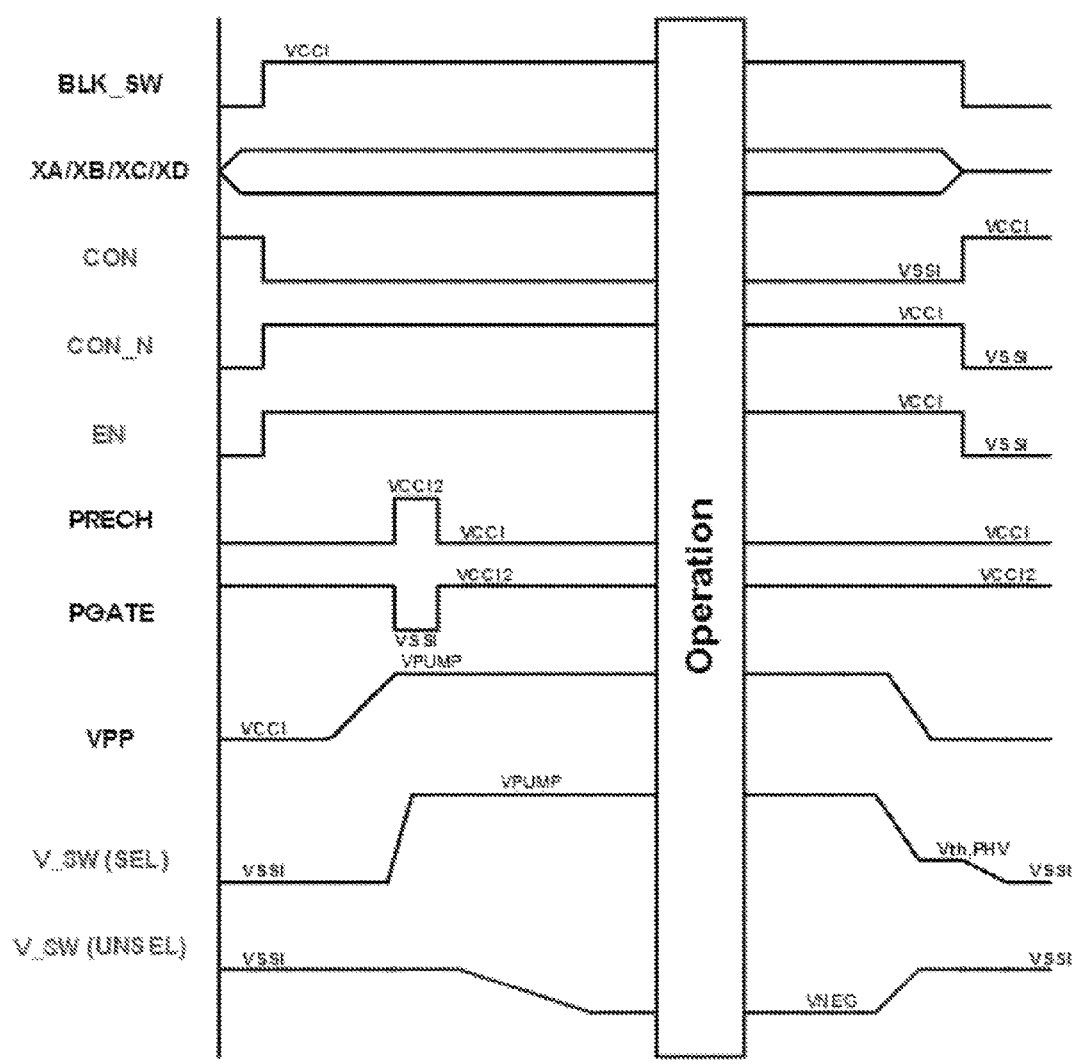
FIGS. 5 to 8 are illustrative timing diagrams explaining a control method of the voltage switching apparatus of FIG. 1.

As illustrated in FIG. 5, the precharge signal PRECH and the control signal PGATE may be simultaneously enabled in a pulse form after the voltage of the output node of the switching signal V_SW is t0 raised to a preset level. Referring to FIG. 5, before the precharge signal PRECH and the control signal PGATE are enabled, the enable signal EN may rise from the ground voltage level VSSI to a first power supply voltage VCCI and thus the voltage of the output node of the switching signal V_SW may be raised to the preset level. In an embodiment, the precharge signal PRECH may be enabled by rising to the second power supply voltage VCCI2 level from the first power supply voltage VCCI level, and the control signal PGATE may be enabled by falling to the ground voltage VSSI level from the second power supply voltage VCCI2 level.

As the control signal PGATE is enabled, the high voltage VPP may be transferred to the output node of the switching signal V_SW through the high voltage PMOS switching element 1153 and the voltage of the output node of the switching signal V_SW may be gradually boosted up from the preset level. When the voltage applied to the source terminal of the high voltage PMOS switching element 1153 reaches the voltage level sufficient to maintain the turn-on state of the high voltage PMOS switching element 1153, the precharge signal PRECH and the control signal PGATE may be disabled.

Accordingly, the voltage of output node of the switching signal V_SW(SEL) in the selected high voltage switching circuit may be boosted up to a second level VPUMP. The voltage of the output nodes of the switching signal V_SW (UNSEL) in the non-selected high voltage switching circuits may be dropped to a negative voltage level VNEG.

Figure 6:
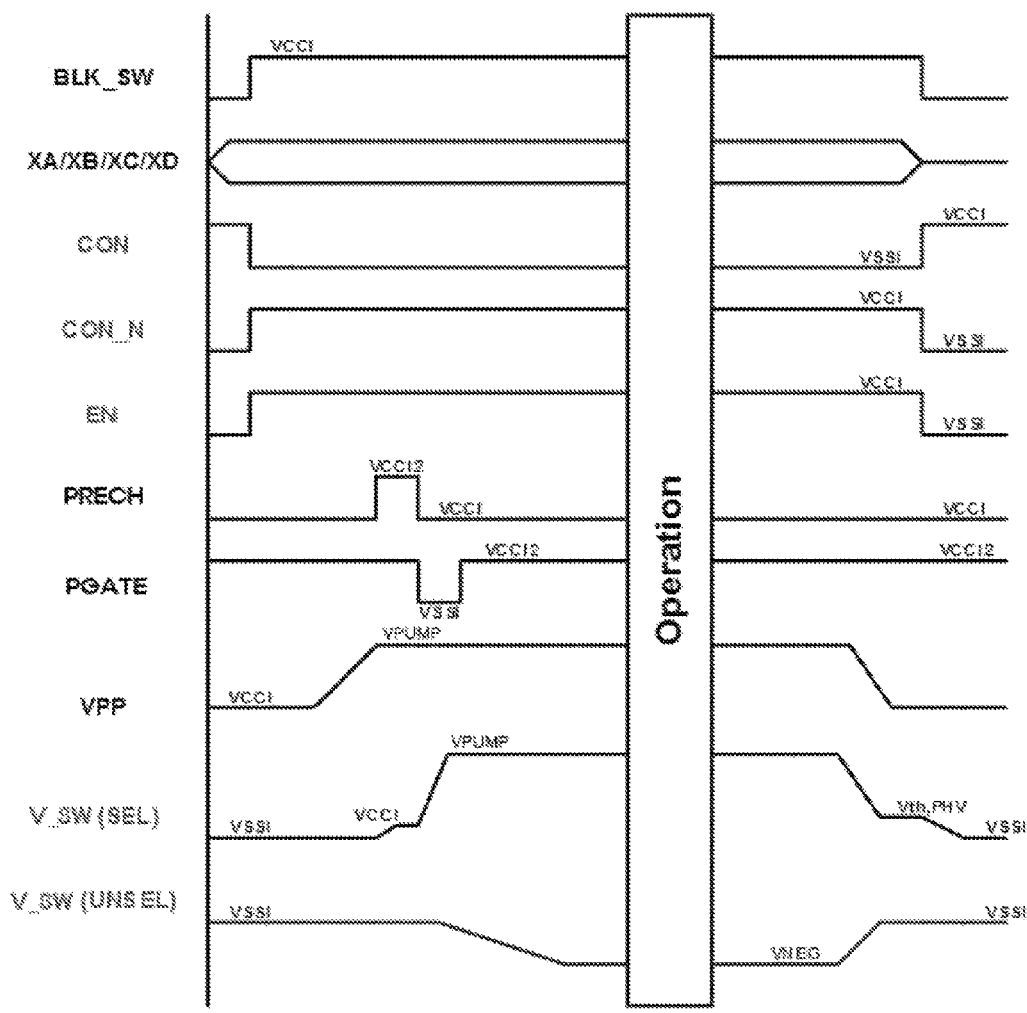

FIG. 6 is a timing diagram illustrating a control method wherein the voltage switching apparatus 10 first enables the precharge signal PRECH in a pulse form to precharge the level of the output node of the switching signal V_SW and then enables the control signal PGATE in a pulse form to boost up the level of the output node of the switching signal V_SW.

When the high voltage switching circuits are controlled as described above, the leakage current in the selected high voltage switching circuit may be minimized.

Figure 7:
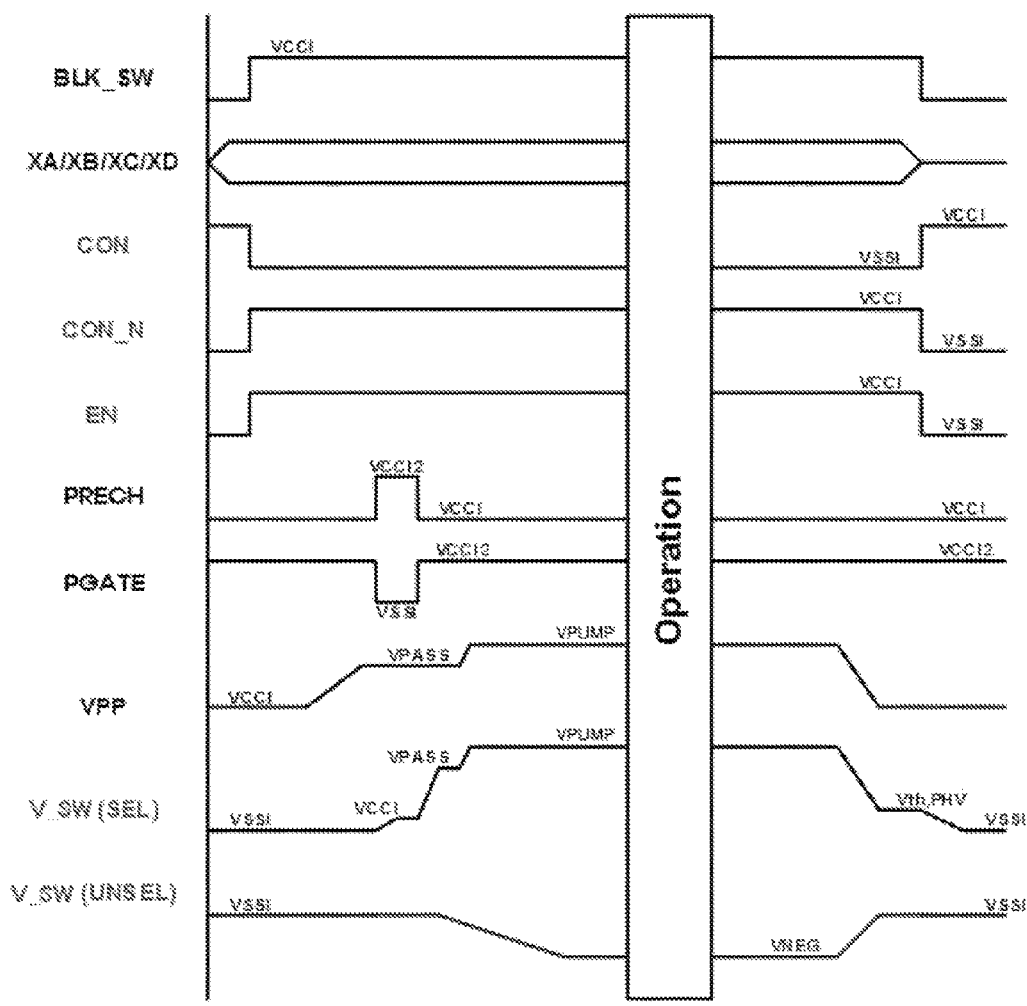

FIG. 7 is a timing diagram illustrating a control method wherein the voltage switching apparatus 10 simultaneously enables the precharge signal PRECH and the control signal PGATE in a pulse form and sequentially raise the voltage level of the high voltage VPP.

As the high voltage switching circuits are controlled as described above, the off state of the non-selected high voltage switching circuits may be certainly maintained, and thus the undesired operation of the non-selected high voltage switching circuits may be prevented.

Figure 8:
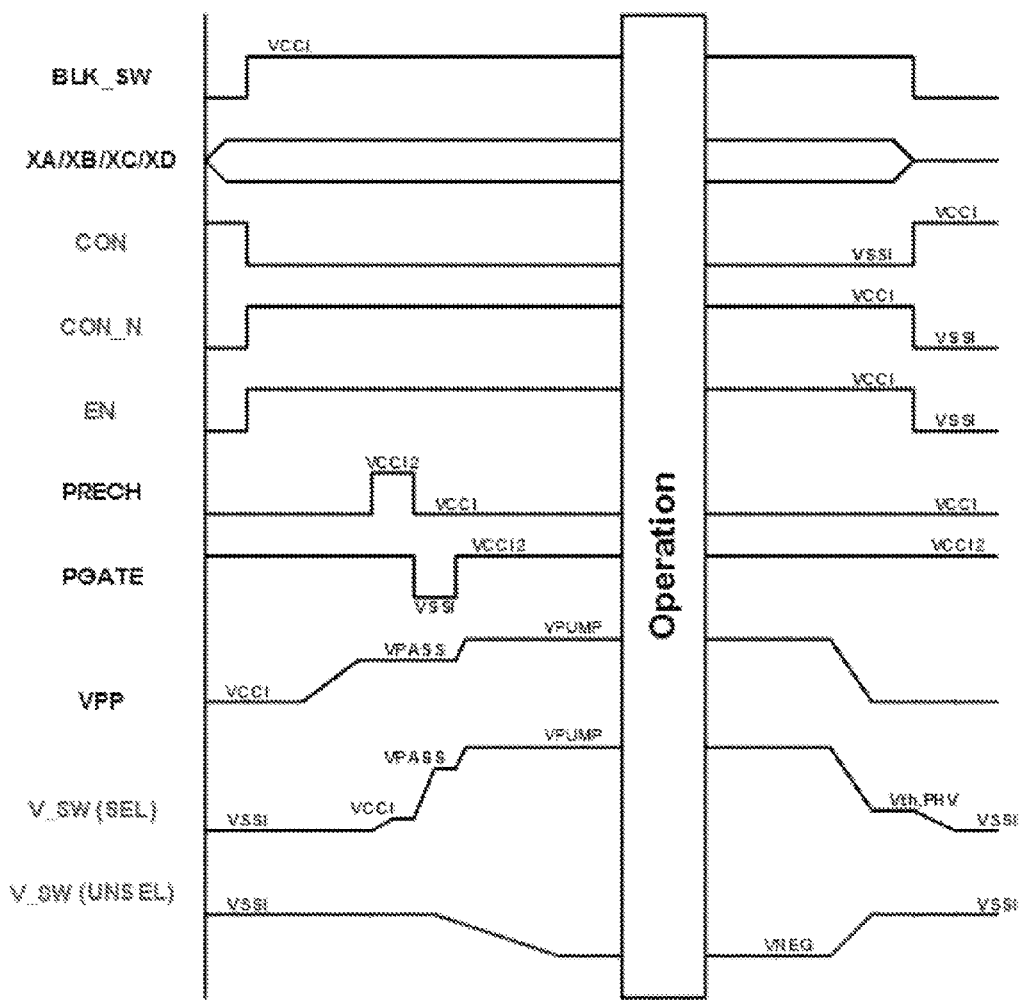

FIG. 8 is a timing diagram illustrating a control method wherein the voltage switching apparatus first enables the precharge signal PRECH in a pulse form to precharge the level of the output node of the switching signal V_SW and then enables the control signal PGATE in a pulse form to boost up the level of the output node of the switching signal V_SW while sequentially raising the voltage level of the high voltage VPP.

The voltage switching apparatus may enable the precharge PRECH and at the same time first boost up the level of the high voltage VPP to a first level VPASS, and then the voltage switching apparatus may boost up the level of the high voltage level VPP to the second level VPUMP after the control signal PGATE is disabled.

Accordingly, the leakage current in the selected high voltage switching circuit may be minimized, and the undesired operation of the non-selected high voltage switching circuits may be prevented.

Figure 9:
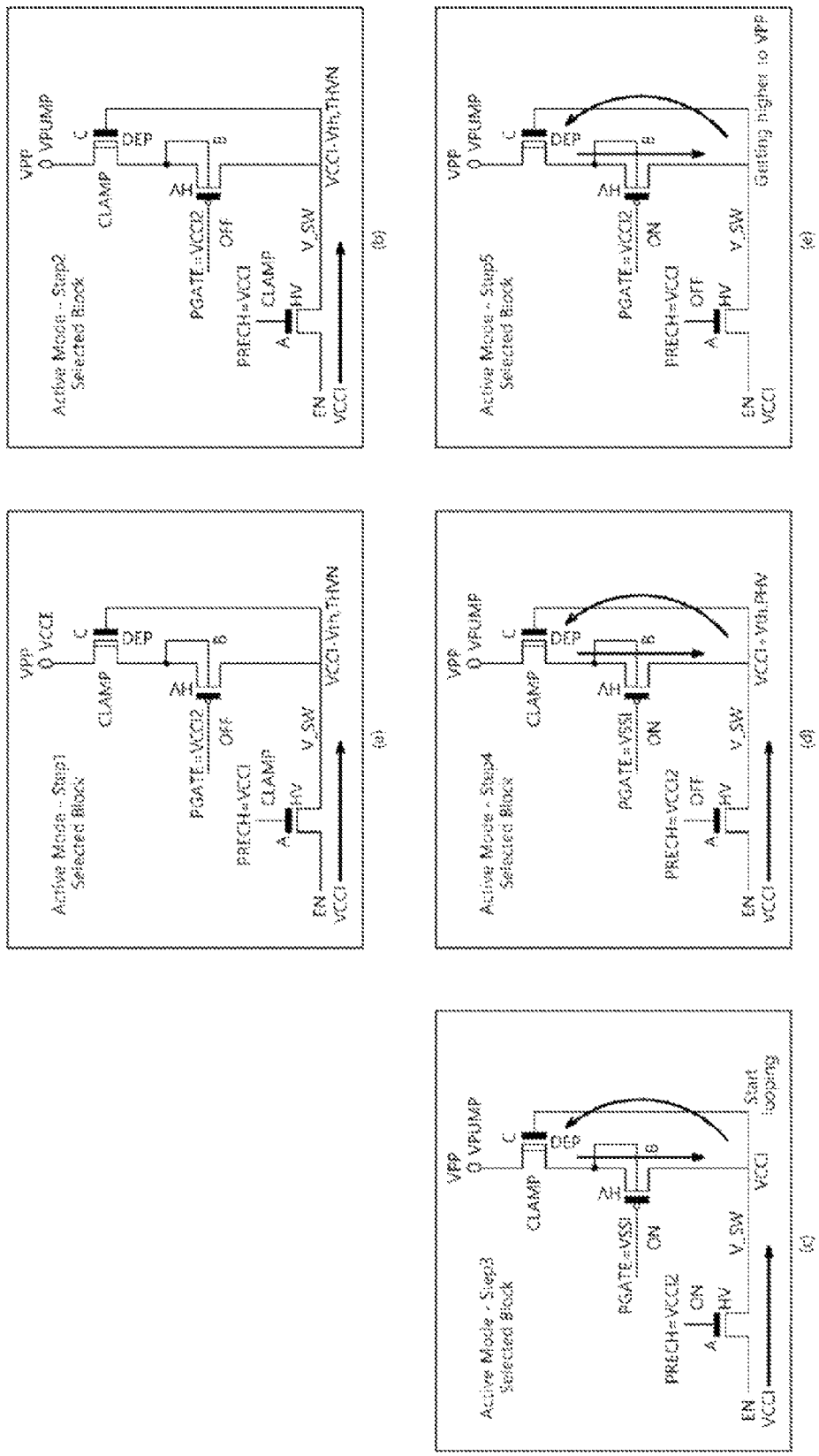
FIGS. 9 and 10 are illustrative diagrams explaining an operation method of the voltage switching apparatus of FIG. 1, according to an embodiment.
Figure 10:
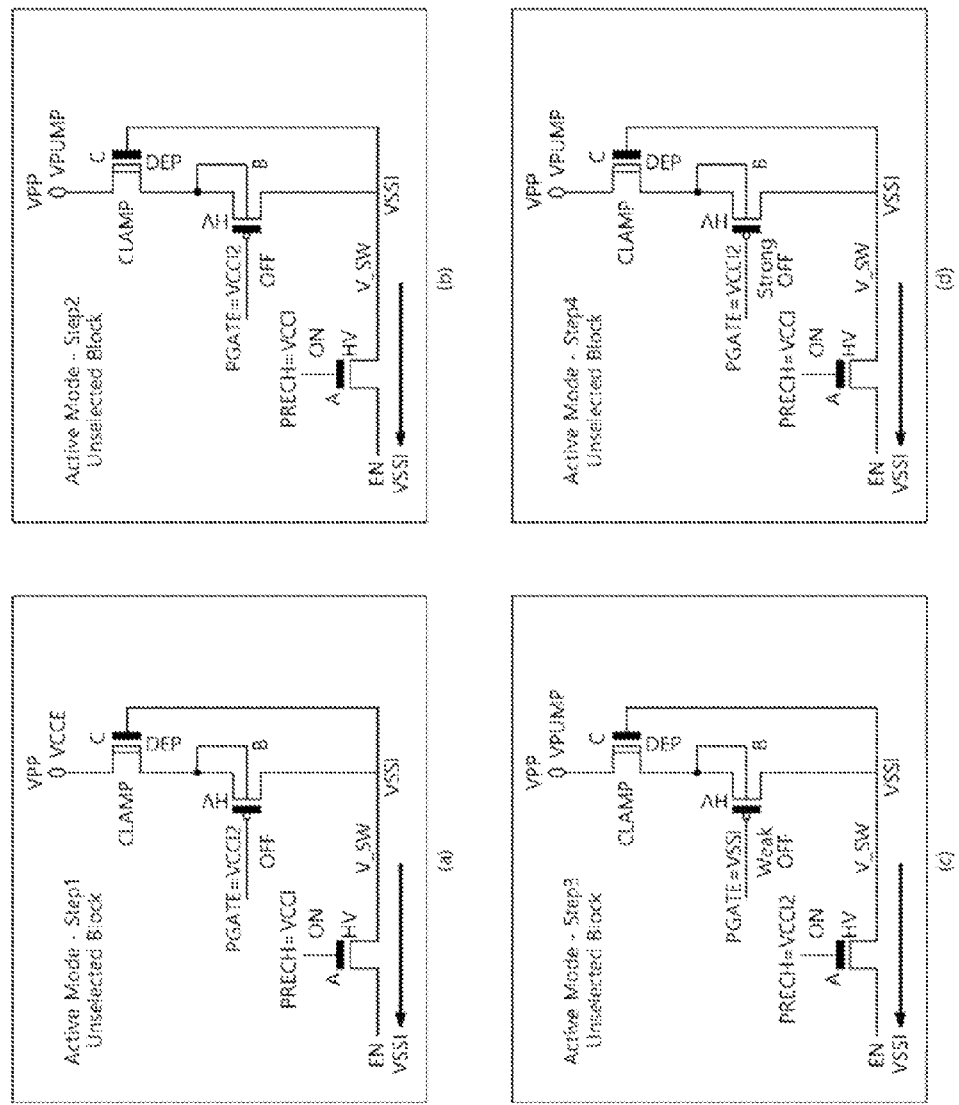

FIGS. 9 to 10 are illustrative diagrams explaining an operation method of a voltage switching apparatus, according to an embodiment. FIGS. 9 to 10 illustrate the operation method when the control signal PGATE is enabled after the precharge signal PRECH is enabled as illustrated in FIG. 6.

FIG. 9 is a diagram explaining an operation of a selected high voltage switching circuit illustrated in FIG. 2, and FIG. 10 is a diagram explaining an operation of a non-selected high voltage switching circuit illustrated in FIG. 2.

The select and non-selected high voltage switching circuits may maintain an off state in a standby mode.

Then, in an active mode, the level of the enable signal EN applied to the selected high voltage switching circuit may be increased to a level of the first power supply voltage VCCI. However, the voltage level of the enable signal EN applied to the non-selected high voltage switching circuit may be maintained to the ground voltage level VSSI.

As illustrated in (a) of FIG. 9, the level of the enable signal EN minus the threshold voltage Vth,THVH of the first switching element 1131 (denoted with "A" in FIGS. 9 and 10) of the precharge unit 113, i.e. [VCCI-Vth,THVN], may be transferred to the output node of the switching signal V_SW in the selected high voltage switching circuit. As illustrated in (a) of FIG. 10, the output node of the switching signal V_SW in the non-selected high voltage switching circuit may be maintained to the ground voltage VSSI level.

Referring to (b) of FIGS. 9 and 10, the second witching element 1151 (denoted with "C" in FIGS. 9 and 10) of the high voltage transfer unit 115 may output the level of the output node of the switching signal V_SW, i.e. VCCI-Vth, THVN, minus the threshold voltage of the second witching element 1151. At this time, since the control signal PGATE is still disabled (PGATE OFF), the voltage of the output node of the switching signal V_SW may be maintained to a previous state VCCI-Vth,THVN as shown in (a) of FIGS. 9 and 10.

Referring to (c) of FIG. 9, when the control signal PGATE is enabled (PGATE ON), the third switching element 1153 (denoted with "B" in FIGS. 9 and 10) having threshold voltage Vth,PHV of the high voltage transfer unit 115 is turned on, the output voltage of the second witching element 1151 of the high voltage transfer unit 115 may be applied to the output node of the switching signal V_SW, and the voltage level of the switching signal V_SW may be boosted up. In an embodiment, the voltage level of the switching signal V_SW may be boosted up about the first power supply voltage level VCCI. Accordingly, the voltage level of the switching signal V_SW is increased over again through the second switching element 1151 and the third switching element 1153.

Referring to (d) of FIG. 9, the control signal PGATE may stay enabled until the voltage level of the switching signal V_SW is boosted up to a level equal to or greater than the predetermined level [VCCI+Vth,PHV]. Accordingly, referring to (e) of FIG. 9, when a voltage level of a source terminal of the third switching element 1153 is equal to or greater than the predetermined level, the control signal PGATE may be disabled, and the high voltage transfer unit 115 may repeat the high voltage transfer process until the voltage of the output node of the switching signal V_SW reaches the level of the high voltage VPP.

Referring to (c) and (d) of FIG. 10, when the control signal PGATE is disabled, the switching element B of the non-selected high voltage switching circuit may be turned on, but the voltage level of the output node of the switching signal V_SW may be maintained to the level of the ground voltage level VSSI. Accordingly, the high voltage transfer process through the high voltage transfer unit 115 may not be performed in the non-selected high voltage switching circuit.

Figure 11:
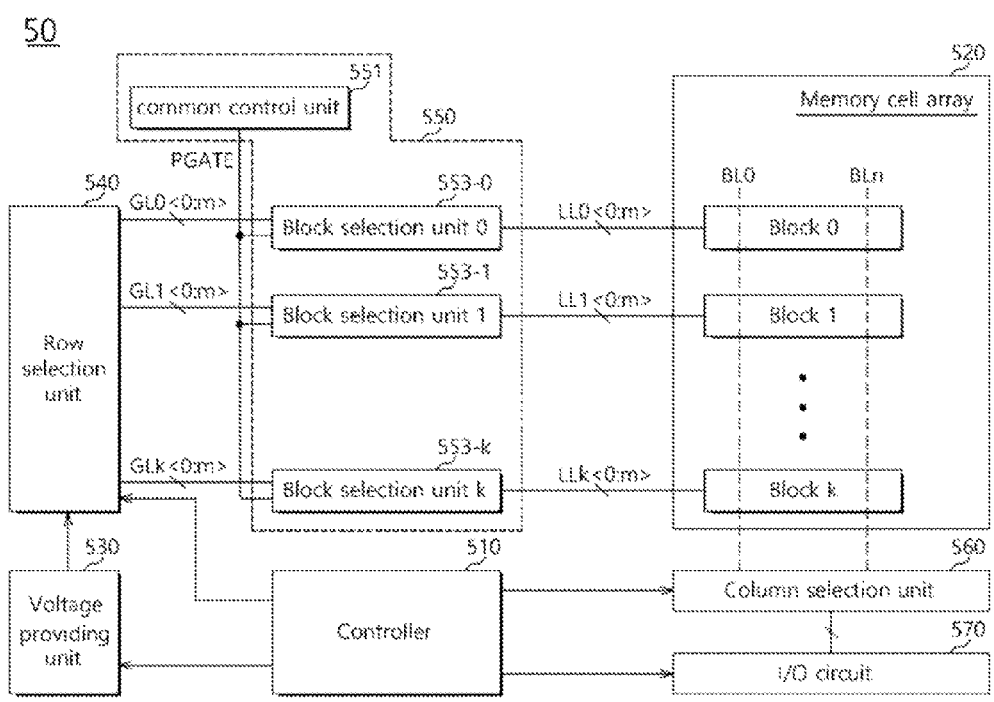
FIG. 11 is a simplified configuration diagram illustrating a semiconductor memory apparatus, according to an embodiment.

FIG. 11 illustrates a semiconductor memory apparatus 50, according to an embodiment.

Referring to FIG. 11, the semiconductor memory apparatus 50 may include a controller 510, a memory cell array 520, a voltage providing unit 530, a row selection unit 540, a block selection circuit 550, a column selection unit 560, and an input/output (I/O) circuit 570.

The controller 510 may control the operation of the semiconductor memory apparatus 50 according to a signal provided from an external apparatus (not shown).

The memory cell array 520 may include a plurality of memory blocks Block0 to Block K. A plurality of memory cells are included in each block which may be electrically coupled between word lines WL and bit lines BL. The memory cells constituting the memory cell array 520 may be nonvolatile memory cells, for example, flash memory cells. The memory cells may be single level cells or multi-level cells.

The voltage providing unit 530 may pump an external voltage according to control of the controller 510. In an embodiment, the voltage providing unit 530 may include at least one pump, and provide a high voltage having a preset level to the row selection unit 540 according to an operation mode of the semiconductor memory apparatus 50.

The row selection unit 540 may decode a row address to access a memory cell of a block to be accessed according to control of the controller 510. The high voltage provided from the voltage providing unit 530 may be applied to a global line GL selected through the row selection unit 540.

The block selection circuit 550 may select a corresponding one of the plurality of blocks and allow the high voltage to be applied to a local line LL by electrically coupling the global line GL and the local line LL of the selected block.

In an embodiment, the block selection circuit 550 may include a common control unit 551 and a plurality of block selection units 553-0 to 553-k.

The common control unit 551 may generate a single control signal PGATE and may commonly provide the generated control signal PGATE to the plurality of block selection units 553-0 to 553-k.

Each of the plurality of block selection units 553-0 to 553-k may select a corresponding one among the plurality of blocks by decoding a block address and apply the high voltage to the selected block in response to the control signal PGATE.

The block selection circuit 550, the common control unit 551 and the plurality of block selection units 553-0 to 553-k of FIG. 11 may correspond to the voltage switching apparatus 10, the common control unit 120 and the plurality of high voltage switching circuits 110-0 to 110-k of FIG. 1, respectively.

The column selection unit 560 may decode a column address to access a memory cell of the block to be accessed according to control of the controller 510.

The I/O circuit 570 may provide data to be programmed to the selected memory cell or read data from the selected memory cell according to control of the controller 510.

Figure 12:
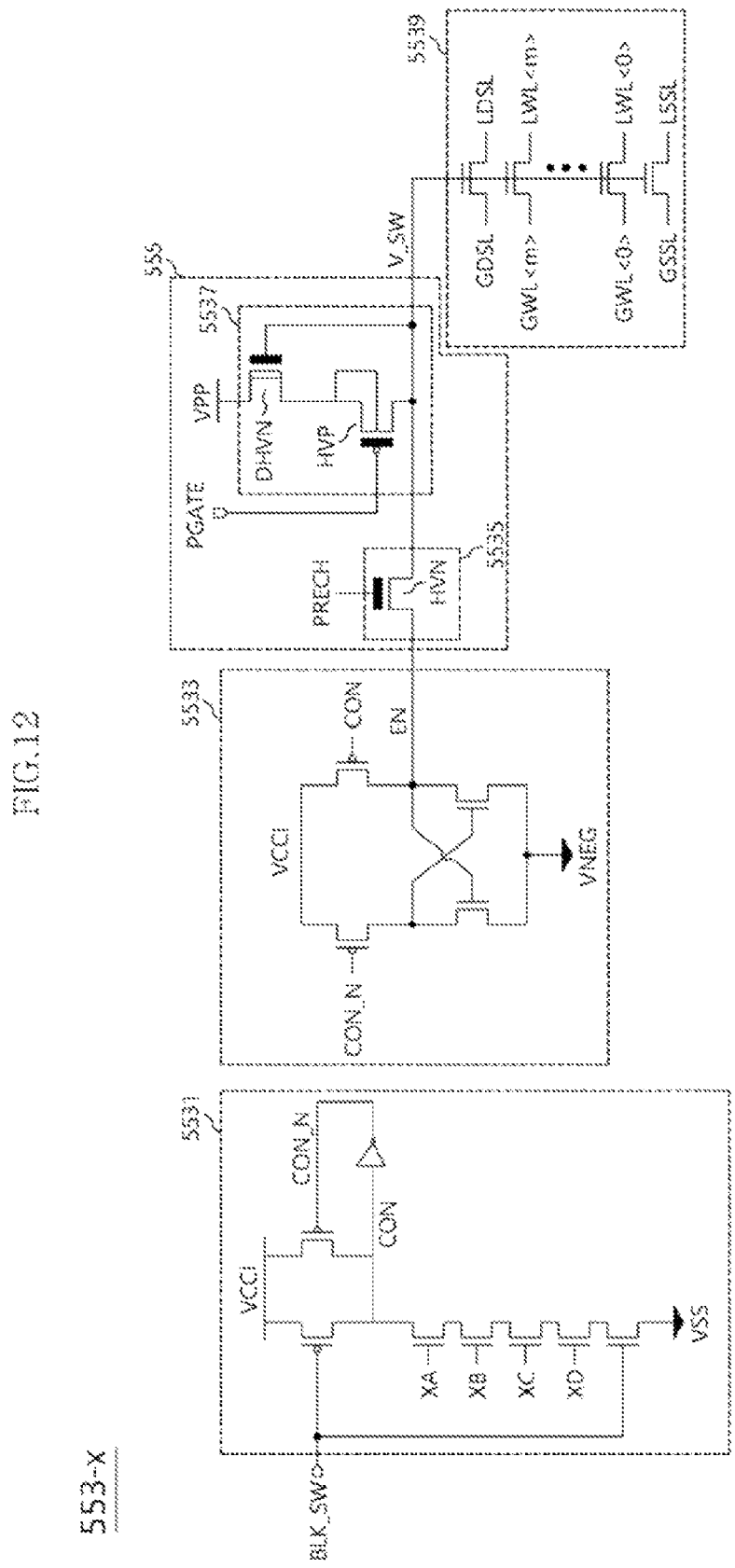
FIG. 12 is a simplified configuration diagram illustrating a block selection unit of FIG. 11.

The block selection units 553-0 to 553-k of the block selection circuit 550 may be configured of, for example, a circuit as Illustrated in FIG. 12.

Referring to FIG. 12, a block selection unit 553-x may include a block address decoder 5531, an enable signal generation unit 5533, a high voltage switching circuit 555, and a switching unit 5539.

The block address decoder 5531 may generate a select signal CON in response to a block switch signal BLK_SW and block address signals XA, XB, XC, and XD.

The enable signal generation unit 5533 may generate an enable signal EN in response to the select signal CON and an inverting signal of the select signal CON_N.

The high voltage switching circuit 555 may be driven based on a level of the enable signal EN and to boost up a voltage of an output node of a switching signal V_SW to a target level in response to the control signal PGATE provided from the common control unit 551.

The switching unit 5539 may include a plurality of high voltage switches driven in response to the switching signal V_SW. When the memory cell array 520 is configured of a flash memory cell array, the switching unit 5539 may include the plurality of high voltage switches coupled between global lines GDSL, GWL<m:0>, and GSSL and local lines LDSL, LWL<m:0>, and LSSL.

The high voltage switching circuit 555 may include a precharge unit 5535 and a high voltage transfer unit 5537.

The high voltage switching circuit 555, the precharge unit 5535 and the high voltage transfer unit 5537 of FIG. 12 may correspond to the high voltage switching circuit 110-x, the precharge unit 113 and the high voltage transfer unit 115 of FIGS. 2 to 10, respectively.

The configuration of the high voltage switching circuit 555 is not limited thereto, and for example, the high voltage switching circuit having the configuration illustrated in FIGS. 3 to 10 may be applied.

A level of a power voltage applied from the outside has been increasingly lowered to realize low power consumption of the semiconductor apparatus, but the internal voltage having a voltage level larger than the external power voltage may be often required in the semiconductor apparatus. In particular, a nonvolatile memory apparatus such as a flash memory apparatus may require a high voltage having a voltage level larger than the external voltage provided from the output side according to an operation mode thereof.

The semiconductor memory apparatus 50 illustrated in FIG. 11 may be a nonvolatile memory apparatus. During a program, read, and erase operations of the semiconductor memory apparatus 50, the high voltage has to be applied to a word line of a memory cell, and the high voltage application operation may be accomplished through the row selection unit 540. An occupied area of the block selection circuit 550 may be minimized using the voltage switching apparatus illustrated in FIGS. 1 to 4.

Figure 13:
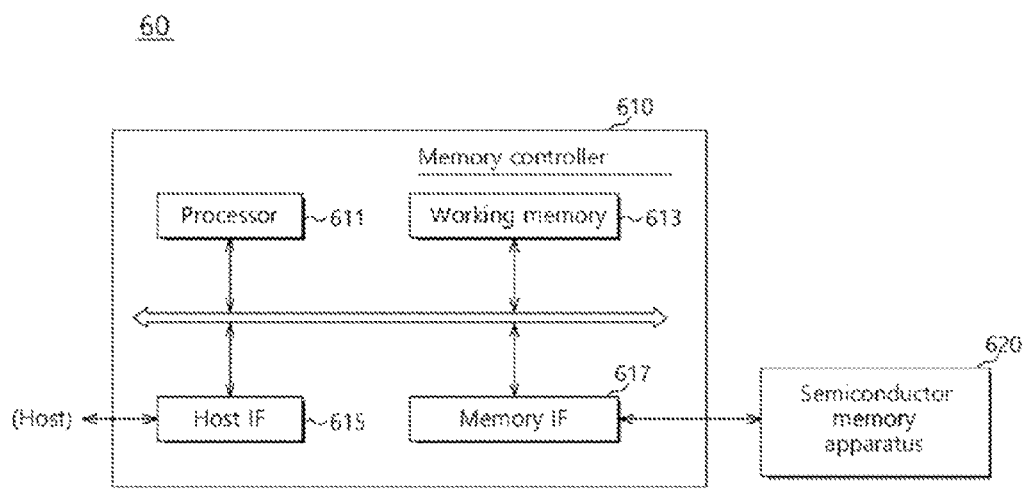
FIGS. 13 and 14 are simplified configuration diagrams illustrating electronic apparatuses, according to embodiments.
Figure 14:
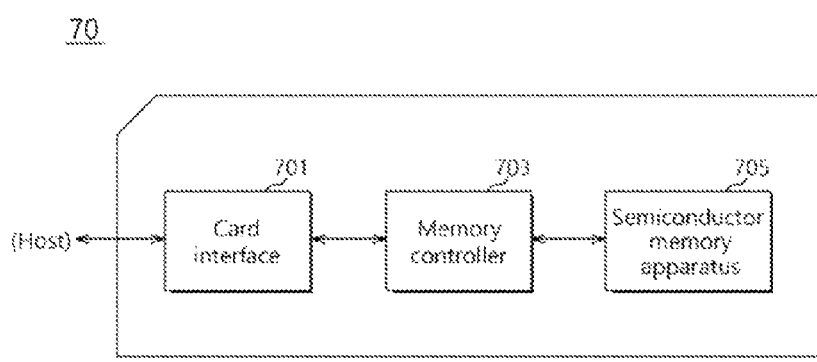

FIGS. 13 and 14 illustrate electronic apparatuses, according to embodiments.

An electronic apparatus 60 illustrated in FIG. 13 may include a memory controller 610 and a semiconductor memory apparatus 620.

The memory controller 610 may access the semiconductor memory apparatus 620 in response to a request from a host. The memory controller 610 may include a processor 611, a working memory 613, a host interface 615, and a memory interface unit 617 coupled via an internal bus.

The processor 611 may control the operation of the memory controller 610. The working memory 613 may store an application, data, a control signal, and the like required for the operation of the memory controller 610.

The host interface 615 may perform protocol conversion for exchanging data and a control signal between the host and the memory controller 610. The memory interface 617 may perform protocol conversion for exchanging of data and a control signal between the memory controller 610 and the semiconductor memory apparatus 620.

For example, the semiconductor memory apparatus 620 may be the semiconductor memory apparatus Illustrated in FIG. 11.

The semiconductor memory apparatus 620 may perform the high voltage transfer operation in response to the request of the host. The semiconductor memory apparatus 620 may apply the high voltage to the selected block in response to the single control signal PGATE commonly provided to the plurality of block selection units.

The electronic apparatus 60 illustrated in FIG. 13 may be used as a disc apparatus or an internal/external memory card of a portable electronic apparatus. The electronic apparatus 60 may be used as an image processor and other application chipsets.

The working memory 613 included in the memory controller 610 may be implemented using the semiconductor memory apparatus illustrated in FIG. 11.

An electronic apparatus 70 illustrated in FIG. 14 may include a card interface 701, a memory controller 703, and a semiconductor memory apparatus 705.

FIG. 14 is an illustrative diagram illustrating the electronic apparatus 70 used as a memory card or a smart card, and the electronic apparatus 70 illustrated in FIG. 14 may be any one among a personal computer (PC) card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may refer to hardware which may support a protocol used in the host, software installed in the hardware which may support the protocol used in the host, or a signal transmission method.

The memory controller 703 may control data exchange between the semiconductor memory apparatus 705 and the card interface 701.

The semiconductor memory apparatus illustrated in FIG. 11 may be employed as the semiconductor memory apparatus 705. Accordingly, the semiconductor memory apparatus 705 may perform a high voltage transfer operation in response to the request of the host. The semiconductor memory apparatus 705 may apply a high voltage to the selected block in response to the single control signal PGATE commonly provided to the plurality of block selection units.

The above embodiments are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. An apparatus for switching a voltage comprising:
    a plurality of high voltage switching circuits operable in response to a single control signal, and suitable for pumping a voltage level of a switching signal to a target level based on the voltage level of the switching signal; and
    a common control unit suitable for generating the single control signal,
    wherein each of the plurality of high voltage switching circuits includes:
    a discharge unit suitable for discharging the voltage level of the switching signal in response to a select signal; and
    a high voltage transfer unit suitable for pumping the voltage level of the switching signal, and outputting the pumped voltage level of the switching signal in response to the single control signal.

2. The apparatus of claim 1, wherein the control signal is a pulse signal which is enabled until the voltage level of the switching signal reaches a predetermined level smaller than the target level after the high voltage switching circuits start the pumping of the voltage level of the switching signal.

3. The apparatus of claim 1, wherein each of the high voltage switching circuits includes:
    a precharge unit suitable for precharging an output node of the switching signal in response to an enable signal and a precharge signal; and
    a high voltage transfer unit suitable for boosting up the voltage level of the switching signal in response to the control signal.

4. The apparatus of claim 3, wherein the control signal is a pulse signal which is simultaneously enabled with the precharge signal until the voltage level of the switching signal reaches the predetermined level smaller than the target level after the high voltage switching circuits start the pumping of the voltage level of the switching signal.

5. The apparatus of claim 4, wherein the target level is provided when the precharge signal and the control signal are enabled.

6. The apparatus of claim 4, wherein a first level is provided as the target level when the precharge signal and the control signal are enabled, and a second level higher than the first level is provided as the target level after the precharge signal and the control signal are disabled.

7. The apparatus of claim 3,
    wherein the precharge signal is a pulse signal enabled during a preset period, and
    wherein the control signal is a pulse signal enabled until the voltage level of the switching signal reaches a predetermined level smaller than the target level after the high voltage switching circuits start the pumping of the voltage level of the switching signal and the precharge signal is disabled.

8. The apparatus of claim 7, wherein the target level is provided when the precharge signal is enabled.

9. The apparatus of claim 7, wherein a first level is provided as the target level when the precharge signal is enabled, and a second level higher than the first level is provided as the target level after the control signal is disabled.

10. The apparatus of claim 1, wherein each of the high voltage switching circuits includes a triple well high voltage NMOS switching element suitable for precharging an output node of the switching signal in response to an enable signal and a precharge signal.

11. The apparatus of claim 1, wherein each of the high voltage switching circuits includes:
    a depletion high voltage NMOS switching element suitable for pumping the voltage level of the switching signal; and
    a high voltage PMOS switching element suitable for outputting the pumped voltage level of the switching signal in response to the single control signal.

12. The apparatus of claim 1, wherein the single control signal is a pulse signal which is enabled until the voltage level of the switching signal reaches a predetermined level smaller than the target level after the high voltage switching circuits start the pumping of the voltage level of the switching signal.

13. A semiconductor memory apparatus comprising:
    a memory cell array including a plurality of memory blocks;
    a plurality of block selection units coupled to the plurality of memory blocks, and operable in response to a single control signal; and
    a common control unit suitable for generating the single control signal,
    wherein the plurality of block selection units select corresponding one among the plurality of memory blocks by decoding a block address and apply a switching signal to the selected memory block in response to the single control signal,
    wherein each of the plurality of block selection units includes a high voltage switching circuit operable in response to the single control signal and is suitable for pumping a voltage level of the switching signal to a target level based on the voltage level of the switching signal.

14. The semiconductor memory apparatus of claim 13, wherein the control signal is a pulse signal which is enabled until the voltage level of the switching signal reaches a predetermined level that is smaller than the target level after the high voltage switching circuits start the pumping of the voltage level of the switching signal.

15. The semiconductor memory apparatus of claim 13, wherein each block includes a plurality of multi-level memory cells.

16. The semiconductor memory apparatus of claim 13, wherein each block includes a plurality of flash memory cells.

17. The semiconductor memory apparatus of claim 13, wherein the high voltage switching circuit includes:
- a discharge unit suitable for discharging the voltage level of the switching signal in response to a select signal; and
- a high voltage transfer unit suitable for pumping the voltage level of the switching signal, and outputting the pumped voltage level of the switching signal in response to the single control signal.

* * * * *